(12) United States Patent
Nakayama et al.

(10) Patent No.: US 8,604,499 B2
(45) Date of Patent: Dec. 10, 2013

(54) LIGHT-EMITTING DEVICE

(75) Inventors: Katsuyoshi Nakayama, Tokyo (JP); Kenji Imakita, Tokyo (JP); Yasuko Osaki, Tokyo (JP); Toshihisa Okada, Tokyo (JP); Akihiro Hishinuma, Koriyama (JP); Shiro Ohtaki, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 238 days.

(21) Appl. No.: 12/953,563

(22) Filed: Nov. 24, 2010

(65) Prior Publication Data

US 2011/0140154 A1    Jun. 16, 2011

Related U.S. Application Data

(63) Continuation of application No. PCT/JP2009/064593, filed on Aug. 20, 2009.

(30) Foreign Application Priority Data

Aug. 21, 2008   (JP) .................................. 2008-212591
Dec. 25, 2008   (JP) .................................. 2008-329890

(51) Int. Cl.
   *H01L 33/00*   (2010.01)
(52) U.S. Cl.
   USPC .......................................................... 257/98
(58) Field of Classification Search
   USPC .................................................... 257/79, 98
   See application file for complete search history.

(56) References Cited

U.S. PATENT DOCUMENTS

| | | |
|---|---|---|
| 6,544,654 B1 | 4/2003 | Fukaya et al. |
| 6,664,567 B2 | 12/2003 | Kyoda et al. |
| 2003/0047735 A1 | 3/2003 | Kyoda et al. |

FOREIGN PATENT DOCUMENTS

| | | |
|---|---|---|
| CN | 1692075 A | 11/2005 |
| CN | 1877875 A | 12/2006 |
| JP | 5-21934 | 1/1993 |
| JP | 05-167209 | 7/1993 |
| JP | 5-347434 | 12/1993 |
| JP | 10-154868 | 6/1998 |

(Continued)

OTHER PUBLICATIONS

Machine translation of JP-2007-067116.*

(Continued)

*Primary Examiner* — Bradley K Smith
(74) *Attorney, Agent, or Firm* — Oblon, Spivak, McClelland, Maier & Neustadt, L.L.P.

(57) ABSTRACT

Provided is a light-emitting device provided with a light reflection layer which has a high light reflectivity and which is less susceptible to deterioration of the reflectivity due to corrosion, and having an improved light extraction efficiency. A light-emitting device comprising a substrate having a conductor layer formed on its surface and a light-emitting element disposed on the conductor layer, characterized in that an overcoat layer is formed between the conductor layer and the light-emitting element, and the overcoat layer is a borosilicate glass which comprises, as represented by mol % based on oxides, from 62 to 84% of $SiO_2$, from 10 to 25% of $B_2O_3$, from 0 to 5% of $Al_2O_3$ and from 0 to 5% in total of at least one of $Na_2O$ and $K_2O$, provided that the total content of $SiO_2$ and $Al_2O_3$ is from 62 to 84%, and may contain from 0 to 10% of MgO and at least one of CaO, SrO and BaO in a total content of at most 5%.

28 Claims, 1 Drawing Sheet

(56) References Cited

FOREIGN PATENT DOCUMENTS

| JP | 11-284297 | 10/1999 |
|---|---|---|
| JP | 2001-322831 | 11/2001 |
| JP | 2003-40647 | 2/2003 |
| JP | 2004-311467 | 11/2004 |
| JP | 2005-244152 | 9/2005 |
| JP | 2006-93486 | 4/2006 |
| JP | 2007-067116 | 3/2007 |
| JP | 2007-121613 | 5/2007 |

OTHER PUBLICATIONS

U.S. Appl. No. 13/075,571, filed Mar. 30, 2011, Tanida, et al.

Chinese Office Action issued Mar. 21, 2012, in Patent Application No. 200980120940.1 (with English-language and Japanese-language translations).

U.S. Appl. No. 13/107,462, filed May 13, 2011, Nakayama.

U.S. Appl. No. 13/190,156, filed Jul. 25, 2011, Ohta.

Office Action issued Sep. 5, 2012 in Chinese Patent Application No. 200980120940.1 (with English translation).

U.S. Appl. No. 12/881,204, filed Sep. 14, 2010, Nakayama, et al.

International Search Report issued Sep. 29, 2009 in PCT/JP09/064593 filed Aug. 20, 2009.

U.S. Appl. No. 13/331,235, filed Dec. 20, 2012, Nakayama, et al.

Office Action issued Feb. 28, 2012 in Japan Application No. 2010-525707 (With English Translation).

\* cited by examiner

LIGHT-EMITTING DEVICE

TECHNICAL FIELD

The present invention relates to a light-emitting device useful for formation of illumination devices such as a light-emitting diode (hereinafter sometimes referred to as LED) device, a high brightness photodiode backlight, a light source related to displays, automobile illumination, decorative illumination, sign and advertisement illumination, and an information display, and a mounting substrate to be used therefor.

BACKGROUND ART

In recent years, along with a tendency to high brightness and whitening of a light-emitting device such as LED, a light-emitting device employing LED has been used for a backlight of a mobile phone, a large sized liquid crystal TV, etc. In order to apply a LED lamp to various applications, it becomes important to obtain a white emission. As typical systems to realize a white emission by a LED lamp, four systems may be mentioned i.e. a system of using three LED chips which emit blue, green and red colors, respectively, a system of combining a blue-emitting LED chip with a yellow or orange-emitting phosphor, a system of combining a blue-emitting LED with a phosphor exciting red and green by the emission, and a system of combining an ultraviolet-emitting LED chip with a blue, green and red-emitting three-color mixed phosphor.

As the above-mentioned system of combining a phosphor, a cannonball structure is known which is prepared by casting a clear resin such as an epoxy resin or silicone resin having a phosphor mixed thereto, followed by solidification to form a resin layer containing the phosphor. Further, a structure is known which is prepared by mounting a LED chip on a substrate having a circuit pattern formed on its main surface and further forming on this substrate a sealing portion made of a clear resin. In such a LED lamp, a light reflection layer made of e.g. silver is formed on the substrate around the mounted LED chip. And, by such a light reflection layer, an emission from the LED chip radiated to the substrate side, or a fluorescence emitted under excitation from the phosphor, is reflected to the forward direction thereby to improve the light extraction efficiency.

However, silver is likely to be corroded, and if it is left to stand, a compound such as AgS is likely to be formed, whereby the light reflectance tends to deteriorate. Therefore, it has been attempted to prevent such a deterioration of the reflectance by forming a resin sealing layer on the silver, but with an epoxy resin or silicone resin which is usually used as the resin sealing agent, the sealing property is weak, and it has been difficult to employ it for products which are required to have a reliability for a long period of time.

Accordingly, in order to prevent corrosion of a silver conductor layer, a method has been proposed to coat the surface of silver with a resin such as a silicone resin, an acryl resin, an epoxy resin or an urethane resin (Patent Document 1). However, even by such a method, moisture or a corrosive gas is likely to enter into the resin or from the interface between the silver conductor layer and the resin, and as the time passes, the silver conductor layer is corroded, and thus such a method has not been useful for products which are required to have a reliability for a long period of time.

On the other hand, as a method to increase the reflectance without using a silver conductor, it has been proposed to use an alumina material or the like having a high reflectance, but firing at a high temperature exceeding 1,000° C. is required, and thus there has been a problem that the load on the production process is substantial.

PRIOR ART DOCUMENT

Patent Document
  Patent Document 1: JP-A-2007-67116

DISCLOSURE OF THE INVENTION

Object to be Accomplished by the Invention

The present invention has been made to solve such problems and has an object to provide a light-emitting device provided with a light reflection layer having a high light reflectance and being less susceptible to deterioration of the reflectance by corrosion, and having an improved light extraction efficiency.

Further, it is an object of the present invention to suppress as far as possible the load on the process in the formation of such a light reflection layer.

Means to Accomplish the Object

The present invention provides a light-emitting device comprising a substrate having a conductor layer formed on its surface and a light-emitting element disposed on the conductor layer, characterized in that an overcoat layer is formed between the conductor layer and the light-emitting element, and the overcoat layer is a borosilicate glass which comprises, as represented by mol % based on oxides, from 62 to 84% of $SiO_2$, from 10 to 25% of $B_2O_3$, from 0 to 5% of $Al_2O_3$ and from 0 to 5% in total of at least one of $Na_2O$ and $K_2O$, provided that the total content of $SiO_2$ and $Al_2O_3$ is from 62 to 84%, and may contain from 0 to 10% of MgO and at least one of CaO, SrO and BaO in a total content of at most 5%.

Further, the present invention provides a light-emitting device comprising a substrate having a conductor layer formed on its surface and a light-emitting element disposed on the conductor layer, characterized in that an overcoat layer is formed between the conductor layer and the light-emitting element, and the overcoat layer comprises, as represented by mass%, at least 60% of a borosilicate glass and at most 40% of a ceramics filler, and the borosilicate glass comprises, as represented by mol % based on oxides, from 62 to 84% of $SiO_2$, from 10 to 25% of $B_2O_3$, from 0 to 5% of $Al_2O_3$ and from 0 to 5% in total of at least one of $Na_2O$ and $K_2O$, provided that the total content of $SiO_2$ and $Al_2O_3$ is from 62 to 84%, and may contain from 0 to 10% of MgO and at least one of CaO, SrO and BaO in a total content of at most 5%.

The present inventors have realized a light-emitting device to avoid deterioration of the reflectance of the light reflection layer by using a conductor layer as the reflection film and by employing a glass as the overcoating layer for the purpose of protecting the conductive layer. It is particularly preferred to use a silver conductor layer as the conductor layer. Further, the present inventors have succeeded to form by one firing step a silver conductor layer as the reflection film and the glass layer to cover the silver conductor layer, by adjusting the composition of the glass layer.

Since the glass layer has a low thermal conductivity, provision of such an overcoat layer may sometimes bring about such a problem that a heat generated by the light-emitting element tends to be hardly dissipated, and the temperature of the element is likely to rise, whereby the luminous efficiency tends to decrease or the service life of the light-emitting element tends to be short.

Advantageous Effects of the Invention

As a conductor layer having a high light reflectance is formed on the surface of a substrate, the emission from the light-emitting element radiated to the substrate side can be reflected at a high reflectance to the opening direction on the opposite side to the substrate. Further, in a case where the substrate has a concave and the light-emitting element is mounted on the bottom surface of the concave, for example, as shown in FIG. 2, by providing a conductor layer also on the wall surface of the concave, the emission on the wall surface side of the light-emitting element can be efficiently reflected to the opening direction.

It is thereby possible to improve the light extraction efficiency thereby to improve the luminous efficiency.

In a case where the light-emitting device has a layer containing a phosphor (hereinafter referred to as a phosphor layer) which emits a visible light when excited by light from the light-emitting element, the fluorescence emitting from this phosphor is also reflected by the conductor layer at a high reflectance to the forward direction on the opposite side to the substrate, whereby it is possible to improve the extraction efficiency of a white light formed by color mixing of a visible light emitted from the phosphor and a light radiated from the light-emitting element.

In the light-emitting device of the present invention, an overcoat layer made of glass is provided on the above conductor layer, so that the conductor layer as a lower layer than this layer is chemically protected. Accordingly, corrosion of the conductor layer is prevented, and deterioration of the light reflectance can be suppressed.

Further, by adjusting the glass composition so that the conductor layer and the overcoat layer can be formed by co-firing, the load on the production process can be reduced.

Further, in a case where the overcoat layer comprises the above-mentioned borosilicate glass and a ceramics filler, the heat dissipating property or strength of the overcoat layer can be increased.

BEST MODE FOR CARRYING OUT THE INVENTION

Figure 1:
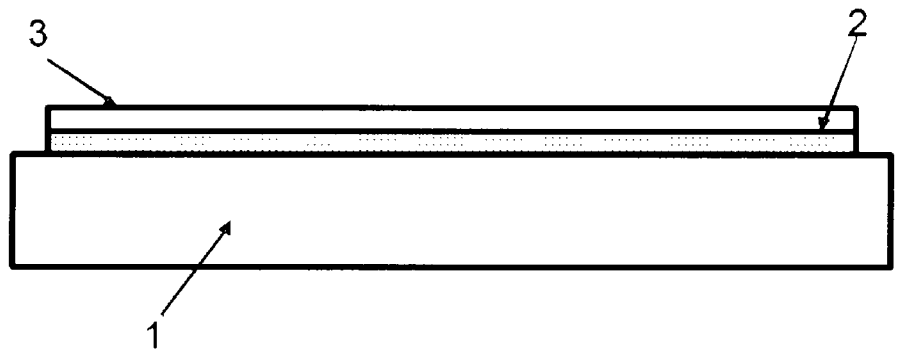
FIG. 1 is a cross-sectional view of a substrate to be used in the present invention.
Figure 2:
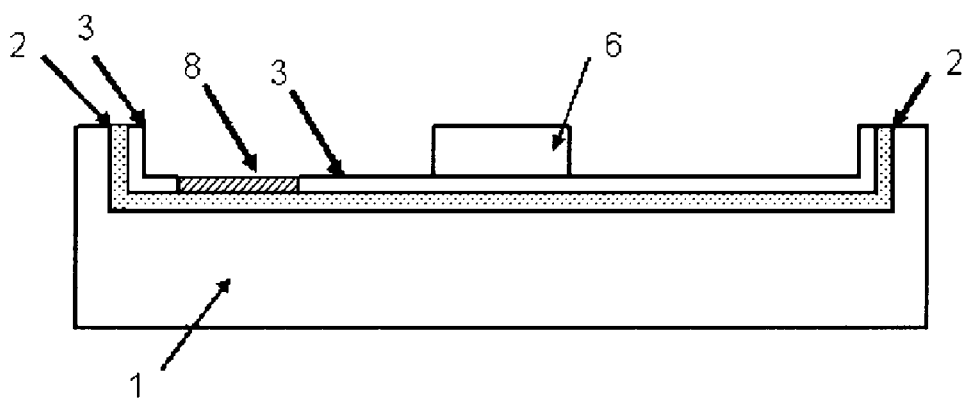
FIG. 2 is a cross-sectional view of an embodiment wherein a light-emitting element is disposed on the substrate to be used in the present invention.

In the light-emitting device of the present invention, a conductor layer as a reflection film is formed on a substrate surface, and a light-emitting element is disposed on the conductor layer which is covered with an overcoat layer containing a borosilicate glass (hereinafter referred to as glass of the present invention) which comprises, as represented by mol % based on oxides, from 62 to 84% of $SiO_2$, from 10 to 25% of $B_2O_3$, from 0 to 5% of $Al_2O_3$ and from 0 to 5% in total of at least one of $Na_2O$ and $K_2O$, provided that the total content of $SiO_2$ and $Al_2O_3$ is from 62 to 84%, and may contain from 0 to 10% of MgO and at least one of CaO, SrO and BaO in a total content of at most 5%.

The substrate is a flat plate member on which a light-emitting element is to be mounted. The material constituting the substrate is not particularly limited, but an inorganic material is preferred, since the glass to be used for the overcoat layer must be baked. From the viewpoint of the thermal conductivity, heat dissipating property, strength and costs, an alumina ceramics, a low temperature co-fired ceramic (hereinafter referred to as LTCC) or aluminum nitride may, for example, be mentioned. In the case of LTCC, the substrate, the surface conductor layer, and the overcoat layer covering the conductor can be formed by co-firing.

For the conductor layer as a reflection film, silver is used from the viewpoint of a high reflectance.

The overcoat layer is a layer to protect the silver conductor layer as a lower layer from e.g. corrosion and is one formed by a dense glass or glass-ceramics. The glass contained in the overcoat layer is a borosilicate glass of the present invention. The glass of the present invention is a component to densify the overcoat layer and is preferably colorless not to lower the reflectance. The above glass is preferably one which can be co-fired with a silver conductor, and it is preferably one which undergoes no coloring when co-fired with the silver conductor. That is, in a case where the silver conductor and the glass are co-fired, if the firing temperature exceeds 900° C., the silver conductor is likely to be deformed, and therefore, the glass for the overcoat layer is required to be one which can be densified by firing at a temperature of at most 900° C. Further, it is preferred to avoid coloring (silver coloring) by a reaction of silver with the glass. Here, silver coloring is such that during the firing of the overcoat layer, silver ions from the silver conductor diffuse into the glass and form a colloid which is colored yellow or red.

Diffusion of silver into the glass tends to increase as the softening point of the glass is low. On the other hand, in order to obtain a dense overcoat layer by firing, it is necessary to make the softening point low. That is, it has been difficult to attain both of suppression of silver coloring and densification by permitting the glass to well flow during the firing. For example, a method is known wherein an oxide of a transition element such as CuO is added into the glass to suppress formation of a colloid of silver ions thereby to suppress silver coloring. However, by the method of adding an oxide of a transition element, the glass will be colored blue or the like by transition metal ions, and thus, such a method is not useful for the purpose of the present invention.

The present inventors have studied a glass composition, as an overcoat layer having a very small light absorption which impairs the function as a silver reflection layer and as a result, have found a glass composition which is colorless and free from silver coloring and which contains no transition element or the like. That is, it is a glass which comprises from 0 to 5% of $Al_2O_3$ and from 0 to 5% in total of at least one of $Na_2O$ and $K_2O$, provided that the total content of $SiO_2$ and $Al_2O_3$ is from 62 to 84% and which contains from 0 to 10% of MgO and may contain at least one of CaO, SrO and BaO in a total content of at most 5%.

It is further preferred that the overcoat layer has high acid resistance and weather resistance.

The light-emitting element is a LED element. It may be one capable of emitting a visible light by exciting a phosphor by radiated light. For example, a blue light-emitting type LED chip or a ultraviolet light-emitting type LED chip may be exemplified. However, without being limited to such exemplified ones, various light-emitting elements may be used depending upon the particular applications or desired emission colors of the light-emitting devices, so long as they are light-emitting elements capable of emitting visible light by exciting phosphors.

It is preferred that the light-emitting device of the present invention is provided with a phosphor layer. The phosphor is excited by light radiated from the light-emitting element to emit visible light, and by color mixing of this visible light and light radiated from the light-emitting element, or by color mixing of visible light emitted from the phosphor or visible light itself, a desired emission color as a light-emitting device is obtained. The type of the phosphor is not particularly limited and may suitably be selected depending upon the desired emission color, the light radiated from the light-emitting element, etc.

Figure 3:
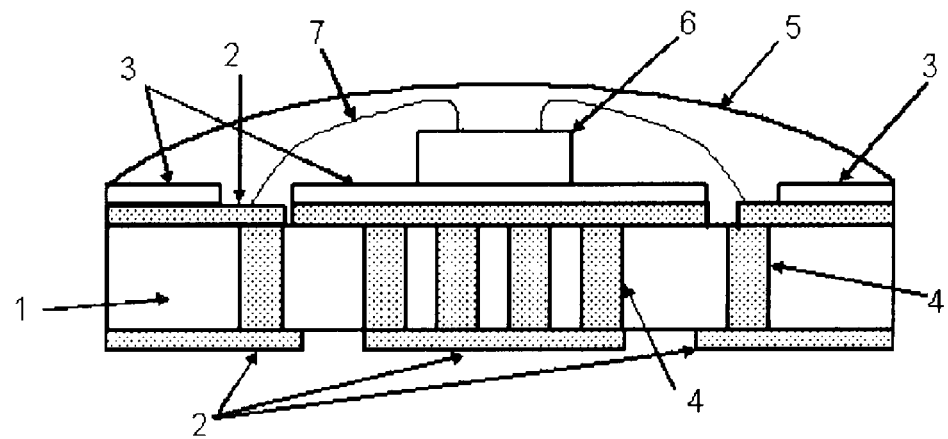
FIG. 3 is a cross-sectional view of a light-emitting device of the present invention.

The phosphor layer is formed as a layer obtained by mixing and dispersing a phosphor in a clear resin such as a silicone resin or an epoxy resin. The phosphor layer may be formed to cover the outside of the light-emitting element (see FIG. 3), but on a covering layer formed to directly cover the light-emitting element, a phosphor layer may separately be provided. That is, the phosphor layer is preferably formed as the topmost layer on the side where the light-emitting element of the light-emitting device is formed.

The light-emitting device of the present invention typically has, on the surface of the substrate, a terminal area to which the light-emitting element is eclectically connected, and a region other than the terminal area is covered by the overcoat layer. In such a case, mounting of the light-emitting element is carried out, for example, by a method wherein a LED chip is bonded (die-bonded) on a substrate by an epoxy resin or a silicone resin, and an electrode on the top surface of the chip is connected to a pad portion of the substrate via a bonding wire such as a gold wire, or by a method wherein a bump electrode such as a solder bump, an Au bump or an Au—Sn eutectic crystal bump provided on the rear side of a LED chip is connected to a lead terminal or pad portion of the substrate by flip chip bonding.

Such a substrate is not particularly limited so long as a silver conductor layer as a reflection film and an overcoat layer to protect it, can be provided thereon. However, in the following, a case where the substrate is a LTCC substrate, will be described.

The LTCC substrate is a substrate which is produced by firing a mixture of a glass powder and a ceramics filler such as an alumina powder, and it is a substrate which can be produced by co-firing together with the silver conductor layer.

The glass powder and the ceramic filler such as an alumina powder, to be used for the LTCC substrate are usually used as formed into a green sheet. For example, firstly, the glass powder and the alumina powder or the like are mixed with a resin such as a polyvinyl butyral or an acrylic resin and, as the case requires, by adding a plasticizer such as dibutyl phthalate, dioctyl phthalate or butylbenzyl phthalate. Then, a solvent such as toluene, xylene or butanol is added thereto to obtain a slurry. This slurry is formed into a sheet by a doctor blade method or the like on a film of e.g. polyethylene terephthalate. Finally, the sheet-formed product is dried to remove the solvent thereby to obtain a green sheet. On such a green sheet, as the case requires, a wiring pattern, a via, etc. may be formed by e.g. green printing using a silver paste.

The composition of glass constituting the LTCC substrate may, for example, comprise, as represented by mol %, 60.4% of $SiO_2$, 15.6% of $B_2O_3$, 6% of $Al_2O_3$, 15% of CaO, 1% of $K_2O$ and 2% of $Na_2O$.

The glass powder to be used for the production of the LTCC substrate is produced by grinding glass obtained by a melting method. The grinding method is not particularly limited so long as the object of the present invention is not impaired and may be either wet grinding or dry grinding. In the case of wet grinding, it is preferred to use water as a solvent. Further, for grinding, a grinding machine such as a roll mill, a ball mil or a jet mill may suitably be used. The glass after grinding is dried and classified as the case requires.

The particle size, shape, etc. of the alumina powder are not particularly limited. Typically, however, one having an average particle size $D_{50}$ of from about 1 to 5 μm is used. For example, AL-45H manufactured by Showa Denko K.K. may be mentioned.

The blend ratio of the glass powder to the alumina powder is typically 40 mass % of the glass powder to 60 mass % of the alumina powder.

The above green sheet is fired and then, as the case required, processed into a desired shape to obtain a substrate. In such a case, one green sheet or a plurality of green sheets laminated are to be fired. Such firing is typically carried out by holding green sheet(s) at from 850 to 900° C. for from 20 to 60 minutes. The firing temperature is more typically from 860 to 880° C.

Further, in the case of forming the silver conductor layer by co-firing, the firing temperature is preferably at most 880° C. If the firing temperature exceeds 880° C., silver or the silver-containing conductor may be softened at the time of firing, whereby the conductor pattern or the shape of the via may not be maintained. The firing temperature is more preferably at most 870° C.

The silver conductor layer as a reflection film to be formed on the substrate surface preferably contains no other inorganic components from the viewpoint of the reflectance.

Now, the overcoat layer will be described.

The overcoat layer is a layer of the glass of the present invention, or a layer of a glass ceramics containing the glass of the present invention (hereinafter referred to as the glass-ceramics of the present invention).

The thickness of the overcoat layer is typically from 5 to 20 μm. If it is less than 5 μm, the planarity is likely to be inadequate. That is, for example, in a case where a via for heat dissipation is provided below the light-emitting element, the forward end of the via is likely to protrude, and if the light-emitting element is disposed thereon, the light-emitting element is likely to be inclined, whereby the light extraction efficiency is likely to be poor. Accordingly, in order to prevent such an inclination of the light-emitting element, the thickness of the covering layer is preferably thicker than the protrusion of the via and preferably at least 5 μm. If the thickness exceeds 20 μm, the heat dissipating properties of the light-emitting device are likely to be impaired, and the luminous efficiency is likely to be low.

In a case where the overcoat layer is to be formed by the glass of the present invention, the overcoat layer is formed, for example, by forming a powder of the glass of the present invention into a paste, which is screen-printed, followed by firing. However, the forming method is not particularly limited so long as it is typically a method capable of forming one having a thickness of from 5 to 20 μm to be planar.

In a case where the overcoat layer is to be formed by the glass-ceramics of the present invention, the overcoat layer is formed, for example, by forming a powder mixture of a powder of the glass of the present invention and the ceramics filler into a paste, which is screen-printed, followed by firing. However, the forming method is not particularly limited, so long as it is typically a method capable of forming one having a thickness of from 5 to 20 μm to be flat.

The glass-ceramics of the present invention contains, as represented by mass %, at least 60% of the glass of the present invention. If the content is less than 60%, the reflectance is likely to be inadequate. In order to make the reflectance higher, the content is more preferably at least 70%. Further, it contains at most 40% of the ceramics filler. The content of the ceramics filler is typically at least 5%. When the ceramics filler is contained, the strength of the overcoat layer may sometimes be made higher. Further, the heat dissipating properties of the overcoat layer may sometimes be made higher.

The above ceramics filler is preferably alumina.

Now, the components of the glass of the present invention will be described. In the following, unless otherwise specified, the composition is shown by mol %, which is represented simply by %.

$SiO_2$ is a glass network former, and it is a component to increase chemical durability, particularly acid resistance and thus essential. If it is less than 62%, the acid resistance is likely to be inadequate. If it exceeds 84%, the melting temperature of the glass tends to be high, or the glass transition point (Tg) tends to be too high.

$B_2O_3$ is a glass network former and is essential. If it is less than 10%, the glass melting temperature becomes high, or the glass tends to be unstable. It is preferably at least 12%. If it exceeds 25%, it becomes difficult to obtain a stable glass, or the chemical durability may deteriorate.

$Al_2O_3$ is not essential, but may be contained within a range of at most 5% in order to increase the stability or chemical durability of the glass. If it exceeds 5%, the transparency of the glass may deteriorate, or silver coloring is likely to occur.

Further, the total content of $SiO_2$ and $Al_2O_3$ is from 62 to 84%. If it is less than 62%, the chemical durability is likely to be inadequate. If it exceeds 84%, the glass melting temperature tends to be high, or Tg tends to be too high.

$Na_2O$ and $K_2O$ are not essential, but are components to lower Tg, and they may be contained in a total amount of up to 5%. If the total amount exceeds 5%, the chemical durability, particularly the acid resistance, is likely to deteriorate, or the electrical insulating properties of a fired product are likely to be low, or silver coloring is likely to occur.

Further, at least one of $Na_2O$ and $K_2O$ is contained. The total content of $Na_2O$ and $K_2O$ is preferably at least 0.9%.

MgO is not essential, but may be contained up to 10% in order to lower Tg or to stabilize the glass. If it exceeds 10%, silver coloring is likely to occur. It is preferably at most 8%.

Any one of CaO, SrO and BaO is not essential, but they may be contained up to 5% in total in order to lower the melting temperature of the glass or to stabilize the glass. If the total amount exceeds 5%, the acid resistance may deteriorate, or silver coloring is likely to occur.

The glass of the present invention essentially comprises the above components, but may contain other components within a range not to impair the object of the present invention. In a case where such other components are contained, the total content of such components is preferably at most 10%. However, no lead oxide is contained.

The overcoat layer of the present invention preferably has an acid resistance of at most 100 μg/cm², more preferably at most 30 μg/cm², further preferably at most 5 μg/cm², particularly preferably at most 1 μg/cm². If the acid resistance exceeds 100 μg/cm², components in the glass are likely to elute into the plating solution, wherein a continuous operation may not be carried out, or the overcoat layer is likely to be turbid, whereby the reflectance may be deteriorated.

The acid resistance of the overcoat layer can be evaluated by measuring a decrease in mass upon expiration of 1 hour after immersing its sintered product in 700 cm³ of an oxalate buffer solution at pH 1.68 at a temperature of 85° C.

In order to make the reflectance particularly high, the glass of the present invention is preferably a glass (hereinafter referred to as glass A of the present invention) comprising from 78 to 84% of $SiO_2$, from 16 to 18% of $B_2O_3$, from 0.9 to 4% in total of at least one of $Na_2O$ and $K_2O$, from 0 to 0.5% of $Al_2O_3$ and from 0 to 0.6% of CaO, or a glass (hereinafter referred to as glass B of the present invention) comprising from 72 to 78% of $SiO_2$, from 13 to 18% of $B_2O_3$, from 0.9 to 4% in total of at least one of $Na_2O$ and $K_2O$ and from 2 to 10% of MgO.

Now, the composition of glass A of the present invention will be described.

$SiO_2$ is a glass network former and is essential. If it is less than 78%, the chemical durability tends to be low. It is preferably at least 80%. If it exceeds 84%, the glass melting temperature tends to be high, or the glass transition point (Tg) tends to be too high, and it is preferably at most 83%, more preferably at most 82%.

$B_2O_3$ is a glass network former and is essential. If it is less than 16%, the glass melting temperature tends to be high, or Tg tends to be too high, and if it exceeds 18%, stable glass tends to be hardly obtainable, or the chemical durability tends to be low. It is preferably at most 17%.

$Al_2O_3$ is not essential, but may be contained within a range of at most 0.5% in order to increase the stability or chemical durability of the glass. If it exceeds 0.5%, the glass melting temperature tends to be high, or Tg tends to be too high. Further, silver coloring tends to occur.

$Na_2O$ and $K_2O$ are components to lower Tg, and at least one of them must be contained. If the total amount is less than 0.9%, the glass melting temperature tends to be high, or Tg tends to be too high, and it is preferably at least 1.0%, more preferably at least 1.5%. If it exceeds 4%, the chemical durability, particularly the acid resistance, tends to deteriorate, or the electrical insulating property of the fired product tends to be low. Further, silver coloring tends to occur. It is preferably at most 3%, more preferably at most 2%.

CaO is not essential, but may be contained within a range of at most 0.6% in order to lower Tg or to stabilize the glass. If it exceeds 0.6%, the glass melting temperature tends to be too low, or the crystallization tends to be accelerated, whereby a clear glass layer tends to be hardly obtainable. Further, silver coloring tends to occur.

Glass A of the present invention essentially comprises the above components, but may contain other components within a range not to impair the purpose of the present invention. In a case where such other components are contained, their total content is preferably at most 10%. However, no lead oxide is contained.

Now, the composition of glass B of the present invention will be described.

$SiO_2$ is a glass network former and is essential. If it is less than 72%, the chemical durability tends to be low. It is preferably at least 73%. If it exceeds 78%, the glass melting temperature tends to be high, or Tg tends to be too high, and it is preferably at most 76%.

$B_2O_3$ is a glass network former and is essential. If it is less than 13%, the glass melting temperature tends to be high, or Tg tends to be too high, and if it exceeds 18%, stable glass tends to hardly be obtainable, or the chemical durability is likely to deteriorate. It is preferably at most 17%.

MgO is a component to lower the melting temperature of the glass and to stabilize the glass, and it is preferably contained in an amount of from 2 to 10%. If it is less than 2%, the effects tend to be inadequate. It is preferably at least 4%. If it exceeds 10%, silver coloring tends to occur. It is preferably at most 8%, more preferably at most 6%.

$Na_2O$ and $K_2O$ are components to lower Tg, and at least one of them must be contained. If the total content is less than 0.9%, the glass melting temperature tends to be high, or Tg tends to be too high, and it is preferably at least 1.0%, more preferably at least 1.5%. If it exceeds 4%, the chemical durability, particularly the acid resistance, tends to deteriorate, or the electrical insulating properties of the sintered product tend to deteriorate. Further, silver coloring tends to occur. It is preferably at most 3%.

Glass B of the present invention essentially comprises the above components, but may contain other components within a range not to impair the purpose of the present invention. In a case where such other components are to be contained, their total content is preferably at most 10%. However, no lead oxide is contained.

EXAMPLES

In Examples 1 to 20, glass raw materials were blended and mixed to obtain a composition as represented by mol % in Tables 1 and 2, and the mixed raw materials were put in a platinum crucible and melted at from 1,550 to 1,600° C. for 60 minutes, and then, the molten glass was cast and cooled. The obtained glass was ground by a ball mill made of alumina using ethyl alcohol as a solvent for from 20 to 60 hours to obtain a glass powder. The glasses in Examples 1 to 5 and 12 to 20 are glasses of the present invention. The glasses in Examples 1 to 4 are glass A of the present invention. The glasses in Examples 12 to 14 are glass B of the present invention. The glasses in Examples 6 to 11 are Comparative Examples. Examples 15 to 19 are Examples of the glass-ceramics of the present invention having an alumina filler (AL-45H manufactured by Showa Denko K.K.) added to the same glass powder as in Example 1, and Example 20 is an example which is not the glass-ceramics of the present invention. The mass ratio of glass to alumina is shown in the columns for "glass" and "alumina" in the Tables.

The average particle size $D_{50}$ (unit: μm) of each glass powder was measured by SALD2100 manufacture by Shimadzu Corporation, and the softening point Ts (unit: ° C.) was measured by a thermal analysis equipment TG-DTA2000 manufactured by Bruker AXS K.K. up to 1,000° C. under a temperature raising rate of 10° C./min. The symbol "-" in the section for Ts in the Tables indicates that Ts could not be measured by these methods. Further, in each of Examples 1 to 11, no crystalline peak was observed at the time of measuring Ts.

The mixture of the glass powder and the alumina powder was put into a mold and subjected to press molding, and the molded product was held at 890° C. for 60 minutes for firing and then processed into a rod shape having a diameter of 5 mm and a length of 20 mm. By exerting a load of 10 g to this rod sample, by means of a thermal expansion-measuring apparatus TD5000SA manufactured by Bruker AXS K.K., the temperature Td (unit: ° C.) was measured at which the sample starts to soften and shrink under a condition of a temperature-raising rate of 10° C./min. Td is preferably at most 780° C. Among Examples, one wherein the value Td was not measured, was identified by "*".

With respect to Examples 1 to 20, one comprising 60% of a mixed powder having the alumina filler added to each glass powder, and 40% of a resin component, as represented by mass %, was kneaded for 1 hour in a porcelain mortar and further dispersed three times by a three-roll mill to obtain a glass paste. Here, as the resin component, one having ethylcellulose and α-terpineol mixed and dispersed in a mass ratio of 85:15 was used.

A silver paste was prepared by blending a conductive powder (S400-2, manufactured by Daiken Chemical Co., Ltd.) and ethylcellulose in a mass ratio of 85:15, then dispersing the blend in a solvent (α-terpineol) so that the concentration of the solid content became 85%, as represented by mass %, followed by kneading for 1 hour in a porcelain mortar and further by dispersion three times by a three-roll mill.

The silver paste was printed on the green sheet, followed by drying, and then, the glass paste was printed on the silver paste, and the printed product was held at 550° C. for 5 hours to decompose and remove the resin component and then held at 870° C. for 30 minutes to carry out firing. The reflectance of the surface of the obtained LTCC substrate was measured. The reflectance was measured by using a spectrometer USB2000 and small sized integrating sphere ISP-RF manufactured by Ocean Optics, and an average value in a visible light region of from 400 to 800 nm was calculated as the reflectance (unit: %). The results are shown in Table 1. Here, the glass powder in Example 11 was not sintered, and therefore no measurement was made.

Since the surface of the silver conductor having no overcoat layer has a reflectance of 95%, the reflectance is preferably as close as possible thereto. If the reflectance is 87% or less, it is not possible to efficiently reflect light from the light-emitting element, such being undesirable as the overcoat layer. A reflectance of at least 92% is particularly preferred.

For the acid resistance test, 4 g of the glass powder was pressed by a mold and fired to obtain a sintered product having a diameter of 14 mm and a height of 15 mm. Then, the sintered product was immersed in 700 $cm^3$ of an oxalic acid buffer solution with a pH 1.68 at a temperature of 85° C., and the mass reduction after expiration of 1 hour was measured. Here, the mass after the immersion was measured after drying at 100° C. for 1 hour. The mass reduction per unit surface area of the sintered product (unit: μg/$cm^2$) is shown in the section for "Acid resistance" in Table 1. Here, the glass powder in Example 11 was not sintered, and no measurement was made.

TABLE 1

| Ex. | 1 | 2 | 3 | 4 | 5 | 6 | 7 | 8 | 9 | 10 | 11 |
|---|---|---|---|---|---|---|---|---|---|---|---|
| $SiO_2$ | 81.6 | 78.0 | 81.6 | 80.7 | 80.0 | 85.0 | 69.5 | 63.2 | 63.2 | 60.4 | 81.6 |
| $B_2O_3$ | 16.6 | 18.0 | 16.6 | 16.6 | 13.0 | 5.0 | 20.5 | 7.6 | 7.6 | 15.6 | 14.8 |
| $Al_2O_3$ | 0 | 0 | 0 | 0.3 | 0 | 0 | 0 | 11.3 | 11.3 | 6.0 | 1.8 |
| CaO | 0 | 0 | 0 | 0.6 | 3.0 | 6.0 | 5.0 | 4.7 | 4.7 | 13.0 | 0 |
| SrO | 0 | 0 | 0 | 0 | 0 | 0 | 0 | 4.9 | 4.9 | 0 | 0 |
| BaO | 0 | 0 | 0 | 0 | 0 | 0 | 0 | 2.0 | 2.0 | 0 | 0 |
| MgO | 0 | 0 | 0 | 0 | 0 | 0 | 0 | 5.3 | 5.3 | 0 | 0 |
| $Li_2O$ | 0 | 0 | 0 | 0 | 0 | 0 | 0 | 1.0 | 0 | 0 | 0 |
| $K_2O$ | 1.8 | 4.0 | 0.9 | 0.9 | 4.0 | 4.0 | 5.0 | 0 | 1.0 | 1.0 | 0.9 |
| $Na_2O$ | 0 | 0 | 0.9 | 0.9 | 0 | 0 | 0 | 0 | 0 | 2.0 | 0.9 |

TABLE 1-continued

| Ex. | 1 | 2 | 3 | 4 | 5 | 6 | 7 | 8 | 9 | 10 | 11 |
|---|---|---|---|---|---|---|---|---|---|---|---|
| $ZrO_2$ | 0 | 0 | 0 | 0 | 0 | 0 | 0 | 0 | 0 | 2.0 | 0 |
| Glass | 100 | 100 | 100 | 100 | 100 | 100 | 100 | 100 | 100 | 100 | 100 |
| Alumina | 0 | 0 | 0 | 0 | 0 | 0 | 0 | 0 | 0 | 0 | 0 |
| $D_{50}$ | 2.5 | 2.5 | 2.5 | 2.5 | 2.5 | 2.5 | 2.5 | 2.5 | 2.5 | 2.5 | 2.5 |
| Ts | 775 | 760 | 776 | 780 | — | — | 770 | 751 | 750 | 856 | — |
| Td | 625 | 588 | 777 | * | 714 | 793 | 595 | 646 | 645 | 717 | |
| Reflectance | 95 | 94 | 93 | 93 | 88 | 86 | 86 | 76 | 76 | 78 | |
| Acid resistance | 0 | 0 | 0 | 2 | 2 | 7 | 23 | 15 | 14 | 8 | |

TABLE 2

| Ex. | 12 | 13 | 14 | 15 | 16 | 17 | 18 | 19 | 20 |
|---|---|---|---|---|---|---|---|---|---|
| $SiO_2$ | 75 | 75 | 75 | 81.6 | 81.6 | 81.6 | 81.6 | 81.6 | 81.6 |
| $B_2O_3$ | 17 | 15 | 13 | 16.6 | 16.6 | 16.6 | 16.6 | 16.6 | 16.6 |
| MgO | 5 | 8 | 10 | 0 | 0 | 0 | 0 | 0 | 0 |
| $K_2O$ | 2 | 2 | 2 | 1.8 | 1.8 | 1.8 | 1.8 | 1.8 | 1.8 |
| $Na_2O$ | 1 | 0 | 0 | 0 | 0 | 0 | 0 | 0 | 0 |
| Glass | 100 | 100 | 100 | 95 | 90 | 80 | 70 | 60 | 40 |
| Alumina | 0 | 0 | 0 | 5 | 10 | 20 | 30 | 40 | 60 |
| $D_{50}$ | 2.5 | 2.5 | 2.5 | 2.5 | 2.5 | 2.5 | 2.5 | 2.5 | 2.5 |
| Ts | 793 | 831 | 854 | 775 | 775 | 775 | 775 | 775 | 775 |
| Td | 724 | 750 | 779 | * | * | 744 | 761 | 790 | 863 |
| Reflectance | 93 | 91 | 89 | 94 | 93 | 93 | 92 | 89 | 83 |
| Acid resistance | 0 | 0 | 0 | 0 | 0 | 0 | 0 | 0 | 0 |

INDUSTRIAL APPLICABILITY

The present invention is useful for a backlight of e.g. a mobile phone, a large sized liquid crystal TV, etc.

The entire disclosures of Japanese Patent Application No. 2008-212591 filed on Aug. 21, 2008 and Japanese Patent Application No. 2008-329890 filed on Dec. 25, 2008 including specifications, claims, drawings and summaries are incorporated herein by reference in their entireties.

Meaning of Symbols
1: LTCC substrate
2: Conductor layer (reflection layer)
3: Overcoat layer
4: Via conductor
5: Sealing resin (phosphor layer)
6: Light-emitting element
7: Bonding wire
8: Gold plating layer

What is claimed is:

1. A light-emitting device, comprising:
    a substrate having a conductor layer formed on a surface thereof;
    a light-emitting element disposed on the conductor layer; and
    an overcoat layer formed between the conductor layer and the light-emitting element;
    wherein the overcoat layer is made a borosilicate glass, the borosilicate glass comprising, by mol % based on oxides:
        62 to 84% of $SiO_2$;
        10 to 25% of $B_2O_3$;
        0 to 5% of $Al_2O_3$;
        0 to 5% in total of at least one of $Na_2O$ and $K_2O$;
        62 to 84% in total of $SiO_2$ and $Al_2O_3$;
        0 to 10% of MgO; and
        0 to 5% of at least one of CaO, SrO, and BaO.

2. The light-emitting device according to claim 1, further comprising a phosphor layer, wherein the phosphor layer emits visible light when excited by light radiated from the light-emitting element.

3. The light-emitting device according to claim 1, wherein:
    the surface of the substrate comprises a terminal area to which the light-emitting element is electrically connected; and
    the overcoat layer is provided in a region other than the terminal area.

4. The light-emitting device according to claim 1, wherein:
    the substrate comprises a concave region; and
    the light-emitting element is disposed on a bottom surface of the concave region.

5. The light-emitting device according to claim 1, wherein the borosilicate glass comprises, by mol % based on oxides:
    78 to 82% of $SiO_2$;
    16 to 18% of $B_2O_3$; and
    0.9 to 4% in total of at least one of $Na_2O$ and $K_2O$.

6. The light-emitting device according to claim 1, wherein the borosilicate glass comprises, by mol % based on oxides:
    72 to 78% of $SiO_2$;
    13 to 18% of $B_2O_3$;
    0.9 to 4% in total of at least one of $Na_2O$ and $K_2O$; and
    2 to 10% of MgO.

7. The light-emitting device according to claim 1, wherein the overcoat layer has an elution amount of at most 30 µg/cm$^2$ when immersed in an oxalic acid solution with pH 1.68 at 85° C. for 1 hour.

8. The light-emitting device according to Claim 1, wherein the overcoat layer covers the conductor layer.

9. The light-emitting device according to claim 1, wherein the substrate is made of an inorganic material.

10. The light-emitting device according to claim 1, wherein the overcoat layer is formed by firing.

11. The light-emitting device according to claim 1, wherein the substrate is made of a low temperature co-fired ceramic.

12. The light-emitting device according to claim 1, wherein the conductor layer is a silver conductor layer.

13. The light-emitting device according to claim 1, wherein the conductor layer is formed by firing a paste.

14. The light-emitting device according to claim 1, wherein:
the substrate is made of an inorganic material; and
the conductor layer is in contact with the substrate.

15. A light-emitting device, comprising:
a substrate having a conductor layer formed on a surface thereof;
a light-emitting element disposed on the conductor layer; and
an overcoat layer formed between the conductor layer and the light-emitting element;
wherein:
the overcoat layer comprises, by mass %, at least 60% of a borosilicate glass and at most 40% of a ceramics filler; and
the borosilicate glass comprises, by mol % based on oxides:
62 to 84% of $SiO_2$;
10 to 25% of $B_2O_3$;
0 to 5% of $Al_2O_3$;
0 to 5% in total of at least one of $Na_2O$ and $K_2O$;
62 to 84%, in total of $SiO_2$ and $Al_2O_3$;
0 to 10% of MgO; and
0 5% in total of at least one of CaO, SrO and BaO.

16. The light-emitting device according to claim 15, wherein the ceramics filler is alumina.

17. The light-emitting device according to claim 15, wherein the overcoat layer covers the conductor layer.

18. The light-emitting device according to claim 15, wherein the substrate is made of an inorganic material.

19. The light-emitting device according to claim 15, wherein the overcoat layer is formed by firing.

20. The light-emitting device according to claim 15, wherein the substrate is made of a low temperature co-fired ceramic.

21. The light-emitting device according to claim 15, wherein the conductor layer is a silver conductor layer.

22. The light-emitting device according to claim 15, wherein the conductor layer is formed by firing a paste.

23. The light-emitting device according to claim 15, further comprising a phosphor layer, wherein the phosphor layer emits visible light when excited by light radiated from the light-emitting element.

24. The light-emitting device according to claim 15, wherein:
the surface of the substrate comprises a terminal area to which the light-emitting element is electrically connected; and
the overcoat layer is provided in a region other than the terminal area.

25. The light-emitting device according to claim 15, wherein:
the substrate comprises a concave region; and
the light-emitting element is disposed on a bottom surface of the concave region.

26. The light-emitting device according to claim 15, wherein the borosilicate glass comprises, by mol % based on oxides:
78 to 82% of $SiO_2$;
16 to 18% of $B_2O_3$; and
0.9 to 4% in total of at least one of $Na_2O$ and $K_2O$.

27. The light-emitting device according to claim 15, wherein the borosilicate glass comprises, by mol % based on oxides:
72 to 78% of $SiO_2$;
13 to 18% of $B_2O_3$;
0.9 to 4% in total of at least one of $Na_2O$ and $K_2O$; and
2 to 10% of MgO.

28. The light-emitting device according to claim 15, wherein the overcoat layer has an elution amount of at most 30 μg/cm² when immersed in an oxalic acid solution with pH 1.68 at 85° C. for 1 hour.

* * * * *